(12) United States Patent
Reboh

(10) Patent No.: US 10,205,021 B1
(45) Date of Patent: Feb. 12, 2019

(54) METHOD OF FABRICATION OF A SEMICONDUCTOR SUBSTRATE HAVING AT LEAST A TENSILELY STRAINED SEMICONDUCTOR PORTION

(71) Applicant: COMMISSARIAT A L'ENERGIE ATOMIQUE ET AUX ENERGIES ALTERNATIVES, Paris (FR)

(72) Inventor: Shay Reboh, Grenoble (FR)

(73) Assignee: COMMISSARIAT A L'ENERGIE ATOMIQUE ET AUX ENERGEES ALTERNATIVES, Paris (FR)

( * ) Notice: Subject to any disclaimer, the term of this patent is extended or adjusted under 35 U.S.C. 154(b) by 0 days.

(21) Appl. No.: 15/852,671

(22) Filed: Dec. 22, 2017

(51) Int. Cl.
| | |
|---|---|
| *H01L 21/76* | (2006.01) |
| *H01L 29/78* | (2006.01) |
| *H01L 21/225* | (2006.01) |
| *H01L 29/06* | (2006.01) |
| H01L 21/762 | (2006.01) |

(52) U.S. Cl.
CPC ...... *H01L 29/7847* (2013.01); *H01L 21/2254* (2013.01); *H01L 21/76283* (2013.01); *H01L 29/0692* (2013.01); *H01L 29/7848* (2013.01)

(58) Field of Classification Search
CPC .......... H01L 21/2254; H01L 21/76283; H01L 29/0692; H01L 29/7847; H01L 29/7848
USPC ....................................................... 438/404
See application file for complete search history.

(56) References Cited

U.S. PATENT DOCUMENTS

| | | | |
|---|---|---|---|
| 10,020,398 B1* | 7/2018 | Cheng | ................. H01L 29/7849 |
| 2015/0340500 A1* | 11/2015 | Brunco | ............. H01L 21/02532 |
| | | | 257/190 |
| 2017/0194498 A1 | 7/2017 | Berthelon et al. | |

FOREIGN PATENT DOCUMENTS

FR            3 046 492 A1       7/2017

OTHER PUBLICATIONS

U.S. Appl. No. 15/490,212, filed Apr. 18, 2017, US 2017-0309483 A1, Shay Reboh, et al.
U.S. Appl. No. 15/452,049, filed Mar. 7, 2017, US 2017-0263607 A1, Sylvain Maitrejean, et al.
U.S. Appl. No. 15/523,742, filed May 2, 2017, US 2017-0358459 A1, Shay Reboh, et al,.
U.S. Appl. No. 15/602,829, filed May 23, 2017, US 2017-0345931 A1, Shay Reboh, et al.

(Continued)

*Primary Examiner* — David S Blum
(74) *Attorney, Agent, or Firm* — Oblon, McClelland, Maier & Neustadt, L.L.P.

(57) ABSTRACT

Method of fabrication of a semiconductor substrate including fabrication of a semiconducting layer such that a first part of the semiconducting layer comprises a compressively strained semiconductor and such that a second part of the semiconducting layer comprises a material different from the compressively strained semiconductor. The second part of the semiconducting layer is located in a principal plane of the semiconducting layer in contact with at least two opposite edges of the first part of the semiconducting layer. The method further includes etching of a trench through the semiconducting layer, delimiting the first part of the semiconducting layer and portions of the second part of the semiconducting layer located in contact with the opposite edges of the first part of the semiconducting layer, relative to the remaining part of the semiconducting layer.

15 Claims, 7 Drawing Sheets

(56) References Cited

OTHER PUBLICATIONS

U.S. Appl. No. 15/603,738, filed May 24, 2017, US 2017-0345915 A1, Remi Coquand, et al.
U.S. Appl. No. 15/852,050, filed Dec. 22, 2017, Shay Reboh, et al.
U.S. Appl. No. 15/711,549, filed Sep. 21, 2017, Shay Reboh, et al.
U.S. Appl. No. 14/555,897, filed Dec. 18, 2014, US 2015-0179474 A1, Sylvain Maitrejean, et al.
U.S. Appl. No. 14/575,329, filed Dec. 18, 2014, US 2015-0179474 A1, Sylvain Maitrejean, et al.
U.S. Appl. No. 14/950,416, filed Nov. 24, 2015, US 2016-0149039 A1, Shay Reboh, et al.
U.S. Appl. No. 15/092,002, filed Apr. 6, 2016, US 2016-0300927 A1, Shay Reboh, et al.
U.S. Appl. No. 15/261,226, filed Sep. 9, 2016, US 2017-0076997 A1, Shay Reboh, et al.
U.S. Appl. No. 15/837,298, filed Dec. 11, 2017, Sylvain Barraud, et al.
U.S. Appl. No. 15/837,405, filed Dec. 11, 2017, Shay Reboh, et al.
U.S. Appl. No. 15/837,217, filed Dec. 11, 2017, Shay Reboh, et al.
U.S. Appl. No. 15/837,281, filed Dec. 11, 2017, Shay Reboh, et al.
U.S. Appl. No. 15/852,648, filed Dec. 22, 2017, Remi Coquand, et al.
U.S. Appl. No. 15/852,681, filed Dec. 22, 2017, Shay Reboh, et al.
B. Vincent et al., "The Ge condensation technique: A solution for planar SOl/GeOl co-integration for advanced CMOS technologies?", Material Science in Semiconductor Processing, 11, 2008, pp. 205-213.

* cited by examiner

METHOD OF FABRICATION OF A SEMICONDUCTOR SUBSTRATE HAVING AT LEAST A TENSILELY STRAINED SEMICONDUCTOR PORTION

TECHNICAL DOMAIN AND PRIOR ART

The invention relates to the domain of fabricating substrates adapted to the fabrication of one or several semiconducting devices and comprising a portion of compressively strained semiconductor for the fabrication of this or several semiconducting devices. The invention is advantageously applicable to the fabrication of P type FET ("Field Effect Transistor") transistors in the portion of compressively strained semiconductor, comprising an active compressively strained SiGe zone. The invention also enables the integration of P type FET transistors with compressively strained channels and possibly other FET transistors, for example of the N type and with channels that are not compressively strained or other P type transistors with channels that are or are not compressively strained, on the same semiconducting layer.

A mechanically strained crystalline material is a material with elongated or shortened crystalline mesh parameter(s). In the case in which the strained mesh parameter is larger than that "natural" parameter of the crystalline material, the material is said to be tensilely deformed. When the strained mesh parameter is smaller than the natural mesh parameter, the material is said to be in compressive or in compression deformed.

Mechanical strain states are associated with these mechanical deformation states of a crystalline material. These deformation states are also commonly referred to as mechanical strain states. In this application, the concept of deformation is generically referred to by the generic term strain.

The performances of a transistor can be improved through the use of a strained channel, in other words in which the semiconductor forming the channel is strained. The nature of this strain may be uniaxial and may be oriented parallel to the length of the channel (in other words the dimension of the channel that is approximately parallel to the direction of current circulation in the channel), or biaxial, in other words oriented along two directions approximately perpendicular to each other and one of which is parallel to the length of the channel and the other is parallel to the width of the channel (in other words the channel dimension that is in the principal plane of the layer in which the channel is formed, approximately perpendicular to the direction of current circulation in the channel).

In a P type MOSFET transistor, a compressive strain or a strain in compression of the channel improves the mobility of charge carriers in the channel. In an N type MOSFET transistor, a tension strain in the channel improves the mobility of charge carriers in the channel.

In order to fabricate such a P type FET transistor with a compressively strained channel, a substrate is used comprising an active layer (layer in which the active zone of the transistor is fabricated) in which at least one region comprises compressively strained semiconductor is used. An example embodiment of such a substrate 10 is described with reference to FIGS. 1 to 3.

The substrate 10 is made from a semiconductor on insulator type substrate, in this case a "Silicon On Insulator" (SOI). The 501 substrate comprises a support layer 12 or thick layer on which there is a "Buried Oxide" (BOX) layer 14, for example comprising $SiO_2$ for which the thickness is for example between about 25 nm and 200 nm, and a surface layer 16, or thin layer, for which the thickness is for example between about 5 nm and 30 nm, in this case comprising silicon and in which the active zones of the FET transistors will be fabricated.

A layer 18 of SiGe is formed first of all by epitaxy on the part(s) of the surface layer 16 in which the compressively strained SiGe will be made, for example in the region(s) of the surface layer 16 in which P type FET transistors will be fabricated (FIG. 1). This position of the layer 18 on the required part(s) of the surface layer 16 can be obtained using a mask in which the opening(s) is (are) located above this or these parts of the surface layer 16. On FIGS. 1 to 5, the SiGe layer 18 covers the entire surface layer 16.

A step to oxidise the SiGe layer 18 can then be applied. This oxidation leads to a migration of germanium atoms originating from layer 18 into the silicon of the surface layer 16. The enrichment of the silicon in the layer 16 with germanium modifies the nature of the silicon in the layer 16 which becomes compressively strained SiGe. On FIG. 2 that shows the structure obtained after this oxidation step, the layer 18 comprises predominantly $SiO_2$ and the layer 16 comprises compressively strained SiGe.

The oxide layer 18 formed by oxidation of SiGe is then removed (FIG. 3). The stack of remaining layers 12, 14 and 16 together form an SiGeOI type substrate with compressively strained SiGe forming the surface layer of this substrate.

This SiGe fabrication technique, named Ge condensation or Ge enrichment, is described for example in the document entitled "The Ge condensation technique: A solution for planar SOI/GeOI co-integration for advanced CMOS technologies?" by B. Vincent et al., Material Science in Semiconductor Processing 11 (2008) pages 205-213.

Different technological steps are then implemented starting from such a substrate. The creation of STI "Shallow Trench Isolation" trenches within the substrate implies that the layer 16 can be etched to form distinct or isolated SiGe portions. Thus, on FIG. 4, an etching mask 20 is deposited on the layer 16, this layer 16 is then etched in accordance with the openings in the mask 20. This etching may be prolonged through the buried dielectric layer 14 and in the support layer 12 (as is the case in the method described herein), and an isolation trench 22 is then formed by depositing a dielectric material in the etched trench (FIG. 5). The substrate 10 comprising different parts isolated by isolation trenches 22 is thus obtained. When compressively strained SiGe is formed in one or several parts of the surface layer 16, one or several other parts of the surface layer 16 still being composed of silicon, the isolation trenches 22 can be made at the SiGe/Si interfaces present in the surface layer 16.

One problem encountered with the method described above is that after the trench(es) has (have) been etched through the layer 16, the compression strain in the compressively strained semiconductor is reduced by more than the reduction due to elastic relaxation of the semiconductor alone. Therefore the beneficial effects related to this strain and fabricated in such a substrate are strongly reduced.

Document FR 3 046 492 discloses a method in which the isolation trenches are replaced by oxide bars formed by oxidation of portions of the semiconductor of the active layer. Avoiding etching the surface layer prevents the large reduction in strain described above. However, such a method is not adapted to regions in which isolation trenches are necessary.

PRESENTATION OF THE INVENTION

One purpose of this invention is to disclose a method of fabricating a semiconducting substrate adapted to the fabrication of at least one semiconducting device, particularly at least one P type FET transistor, in a least one portion of compressively strained semiconductor within the semiconducting substrate, in which excessive relaxation of the strained semiconductor is avoided during fabrication of the substrate and that is compatible with the fabrication of isolation trenches passing through the active layer and at least part of one or several layers present under the active layer.

To achieve this, the invention discloses a method of fabricating a semiconducting substrate including the implementation of at least the following steps:

fabricate a semiconducting layer such that at least one first part of the semiconducting layer comprises a compressively strained semiconductor and such that at least one second part of the semiconducting layer comprises at least one material different from the compressively strained semiconductor, the second part of the semiconducting layer being located in a principal plane of the semiconducting layer in contact with at least two first opposite edges of the first part of the semiconducting layer;

etch at least one trench at least through the semiconducting layer, delimiting the first part of the semiconducting layer and portions of the second part of the semiconducting layer located in contact with said at least two first opposite edges of the first part of the semiconducting layer, relative to the remaining part of the semiconducting layer.

In this method, the semiconducting layer is designed such that a material different from the compressively strained semiconductor is present in contact with at least two opposite edges of the first part of the semiconducting layer that comprises the compressively strained semiconductor. This other material is judiciously used so that it forms portions of material that prevent excessive relaxation of the strained semiconductor during etching of the trench(es) that delimit the part of the compressively strained semiconductor and these portions of material relative to the remaining part of the semiconducting layer, at least at the two opposite edges of the portion of compressively strained semiconductor. Unlike methods according to prior art in which the different parts of the semiconducting layer are separated from each other by one or several isolation trenches, portions of the second part of the semiconducting layer are included with the first part of the semiconducting layer comprising the compressively strained semiconductor, in the region delimited by the trench(es). Thus, the compressively strained semiconductor does not relax excessively (at least along the direction approximately perpendicular to the two first opposite edges of the first part of the semiconducting layer) following etching of the trench(es) through the semiconducting layer, so that a good level of compression strain can be maintained in the first part of the semiconducting layer, notwithstanding etching of the trench.

Furthermore, due to the presence of portions of the second part of the semiconducting layer interposed between the first part of the semiconducting layer and the trench(es), this or these trenches can be made to any depth while avoiding excessive relaxation of the strain, and in particular can pass through at least part of the thickness of one or several other layers located under the semiconducting layer.

Such a substrate is well adapted to the use of a CMOS technology to create one or several P type FET transistors with a compressively strained channel in the first part of the semiconducting layer, and one or several other FET transistors, for example P or N type and having a channel that is or not compressively strained in another part of the substrate.

Such a substrate is well adapted to the fabrication of FDSOI type FET transistors, and/or P type FET transistors comprising a compressively strained SiGe channel.

The principal plane of the semiconducting layer is a plane parallel to the substrate, in other words parallel to the principal faces of the semiconducting layer that correspond to the two largest faces of the semiconducting layer.

The material different from the compressively strained semiconductor may not be compressively strained or may comprise a compression strain with a level or intensity lower than that of the compressive strain in the semiconductor in the first part of the semiconducting layer. For example, this material may be an unstrained semiconductor or a tensilely strained semiconductor.

The section of the first part of the semiconducting layer in the principal plane of the semiconducting layer may be approximately rectangular or a combination of several rectangles.

The portions of the second part of the semiconducting layer may completely surround the first part of the semiconducting layer in the principal plane of the semiconducting layer. In this case, an excessive relaxation of the strain in the semiconductor of the first part of the semiconducting layer is avoided at all edges of the first part of the semiconducting layer. In this configuration and when the section of the first part of the semiconducting layer in the principal plane of the semiconducting layer is delimited by edges oriented along two directions approximately perpendicular to each other, excessive relaxation of the strain is prevented along these two directions.

As a variant, at least two second opposite edges of the first part of the semiconducting layer approximately perpendicular to the two first edges, may be in contact with the trench, in other words without the presence of portions of the second part of the semiconducting layer between these second edges of the first part of the semiconducting layer and the trench. In this case, partial relaxation of the strain can occur along a direction approximately perpendicular to the two second edges, while preventing this excessive relaxation of this strain along the direction approximately perpendicular to the two first edges.

The compressively strained semiconductor may comprise SiGe and/or the material different from the compressively strained semiconductor may comprise silicon. According to one particular configuration, this silicon may be tensilely strained.

In this case, when the compressively strained semiconductor comprises SiGe and the material different from the compressively strained semiconductor comprises silicon, the semiconducting layer may be made by enrichment with germanium, or condensation of germanium, in a silicon layer.

For example, the semiconducting layer may be made by implementation of the following steps:

epitaxy of a layer of SiGe on at least one first part of a layer of silicon intended to form said first part of the semiconducting layer, at least one second part of the silicon layer not covered by the SiGe layer being intended to form said second part of the semiconducting layer;

oxidation of the layer of SiGe, causing enrichment of the first part of the silicon layer with germanium and forming the first part of the semiconducting layer that comprises compressively strained SiGe;

remove an oxide layer formed by oxidation of the SiGe layer.

Before starting enrichment with germanium, the silicon layer may comprise tensilely strained silicon. For example, the silicon layer may correspond to the surface layer of an sSOI ("strained Silicon On Insulator") substrate. Some of the germanium atoms introduced into the silicon layer during the enrichment with germanium cancel out the tensile strain in the first part of the silicon layer, and the other germanium atoms introduced into the silicon layer apply compression strain in the first part of the silicon layer.

Furthermore, the compressively strained semiconductor corresponding to SiGe may have a germanium concentration between about 20% and 50%. However, it is possible that this germanium concentration could be between about 20% and 100% (if the germanium concentration is equal to 100%, with a compressively strained semiconductor corresponding to germanium). The germanium concentration in the semiconductor in this case is the atomic percentage of germanium in this semiconductor.

The method may also comprise implementation of a step to form at least one dielectric material in the trench after etching of the trench, forming an electrical isolation trench between the first part of the semiconducting layer and portions of the second part of the semiconducting layer.

During fabrication of the semiconducting layer, a buried dielectric layer may be arranged between the semiconducting layer and a support layer.

In this case, the trench may pass through the buried dielectric layer and a part of the thickness of the support layer. Such a trench is fabricated particular when the fabrication of STI type trenches is necessary.

The method may be such that:
the semiconducting layer is fabricated such that it comprises several first parts comprising the compressively strained semiconductor, the second part of the semiconducting layer being located in the principal plane of the semiconducting layer in contact with at least the two first opposite edges of each of the first parts of the semiconducting layer, and
the trench is etched by delimiting the first parts of the semiconducting layer and portions of the second part of the semiconducting layer located in contact with said at least two first opposite edges of each of the first parts of the semiconducting layer.

The invention also relates to a method of fabricating at least one FET transistor, in which said at least one FET transistor is of the P type and is made in the first part of the semiconducting layer of a semiconducting substrate obtained by use of the fabrication method described above.

Advantageously, one or several P type FET transistors may be made in the portion of compressively strained semiconductor, and a dimension of at least one of the portions of the second part of the semiconducting layer in the principal plane of the semiconducting layer and approximately perpendicular to a lateral edge of the trench, may be such that said at least one of the portions of the second part of the semiconducting layer is not located in the channel of the or each of the P type FET transistors, or is not located in an active zone of the or each of the P type FET transistors.

Said at least one FET transistor may be made in the first part of the semiconducting layer such that the portions of the second part of the semiconducting layer are not located in the channel of said at least one FET transistor.

The channel of said at least one FET transistor may be oriented approximately perpendicular to the two first opposite edges of the first part of the semiconducting layer.

BRIEF DESCRIPTION OF THE DRAWINGS

This invention will be better understood after reading the description of example embodiments given purely for information and that are in no way limitative with reference to the appended drawings on which.

Figure 1:
FIGS. 1 to 5 represent a method of fabricating a semiconducting substrate comprising a compressively strained semiconducting layer.
Figure 2:
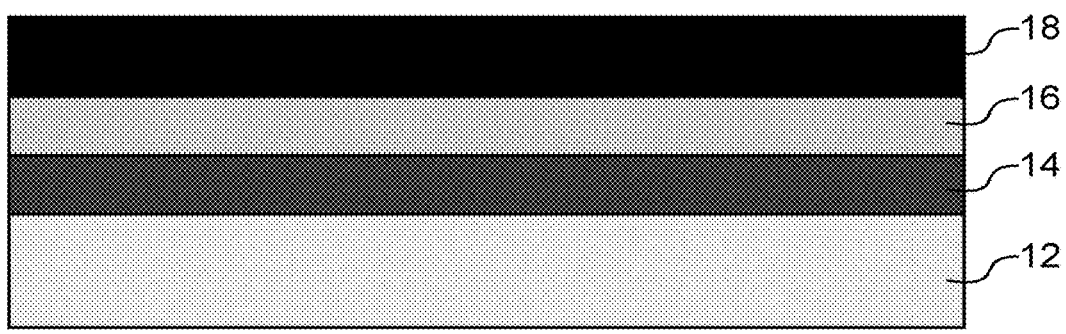
Figure 3:
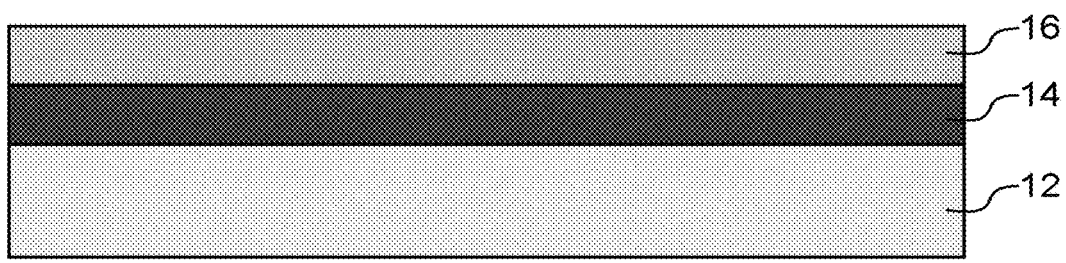
Figure 4:
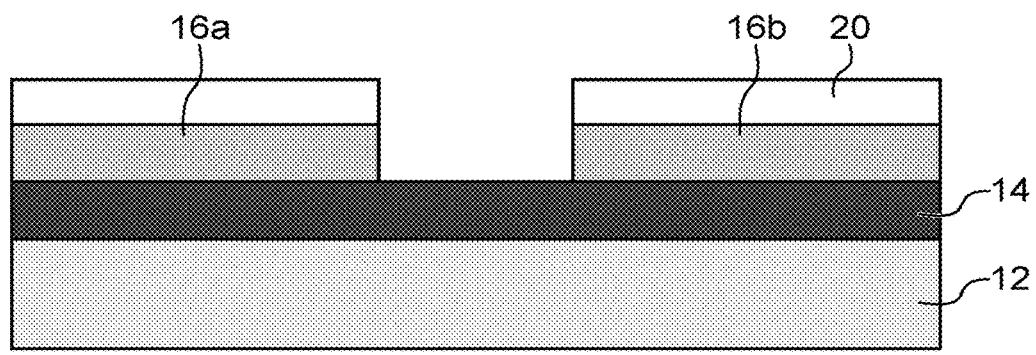
Figure 5:
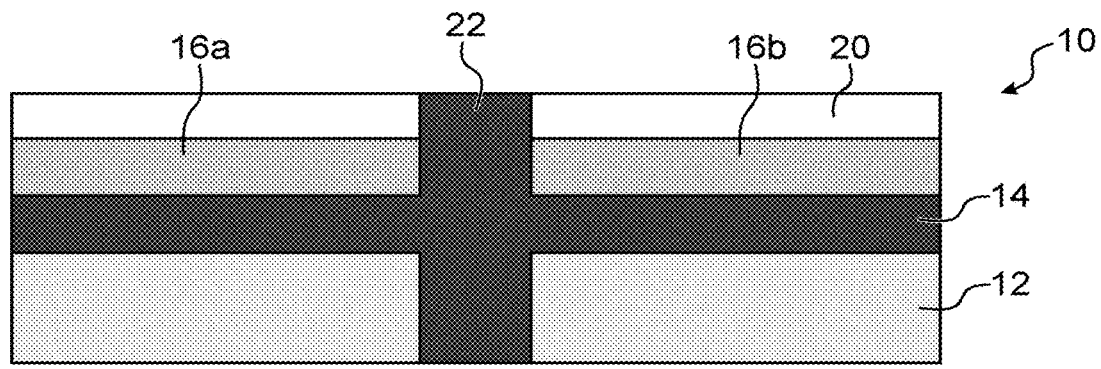

Identical, similar or equivalent parts of the different figures described below have the same numeric references to facilitate comparison between the different figures.

The different parts shown on the figures are not necessarily all at the same scale, to make the figures more easily understandable.

It must be understood that the different possibilities (variants and embodiments) are not mutually exclusive and that they can be combined with each other.

DETAILED PRESENTATION OF PARTICULAR EMBODIMENTS

One particular embodiment of a method of fabricating a semiconducting substrate 100 adapted to the fabrication of at least one semiconducting device such as one or several FET transistors in at least one compressively strained semiconducting portion of the substrate, is shown on FIGS. 6 to 13.

This method is used starting from an SOI substrate similar to that described above with reference to FIGS. 1 to 5, and comprising the support layer 12, the buried dielectric layer 14 and the surface layer 16 of silicon that is for example between about 6 nm and 8 nm thick.

A first step is applied to form different parts comprising different materials within the surface layer 16. One or several first parts 24 comprising compressively strained semiconductor, in this case SiGe, are intended to be fabricated for the formation of P type FET transistors, and one or several second parts 26 comprising the unstrained semiconductor, in this case silicon, are intended to be fabricated, for example for the formation of N type FET transistors. The different parts of the surface layer 16 will be isolated by isolation trenches, in this case STI type trenches.

In the example described herein with reference to FIGS. 6 to 13, a single first part 24 and a single second part 26 formed around the first part 24 are made in the surface layer 16. The locations of the isolation trench(es) intended to isolate the fabrication zone of P type transistors from the remaining part of the surface layer 16 are symbolically shown by the dashed line referenced 28. Furthermore, the first part 24 is intended to be formed from compressively strained SiGe, and the second part 26 is intended to be formed from the initial silicon in the surface layer 16.

During this first step, a first mask 30 is formed on the surface layer 16 to define the part(s) of the surface layer 16 in which the semiconductor will be modified to become compressively strained SiGe, and the part(s) of the surface layers 16 in which the semiconductor will be silicon. On FIG. 6, this first mask 30 does not cover the first part 24 of the surface layer 16 intended to comprise compressively strained SiGe and covers the second part 26 of the surface layer 16 that is intended to comprise silicon.

The first mask 30 may for example comprise a first layer of $SiO_2$ with a thickness of between about 5 nm and 10 nm, and a second layer of SiN with a thickness between about 30 nm and 100 nm.

Figure 6:
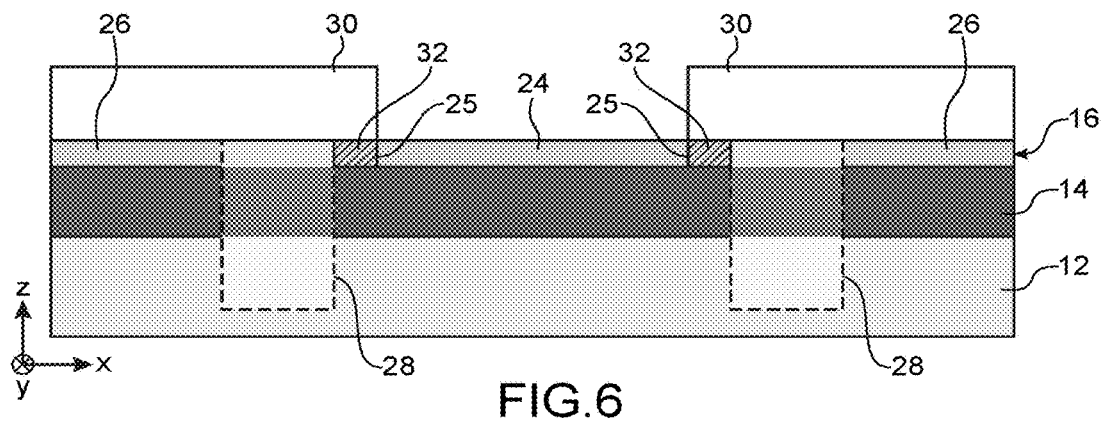
FIGS. 6 to 13 represent one particular embodiment of a method of fabricating a semiconducting substrate and a method of making FET transistors in at least one compressively strained semiconducting portion of the substrate, according to this invention.
Figure 7:
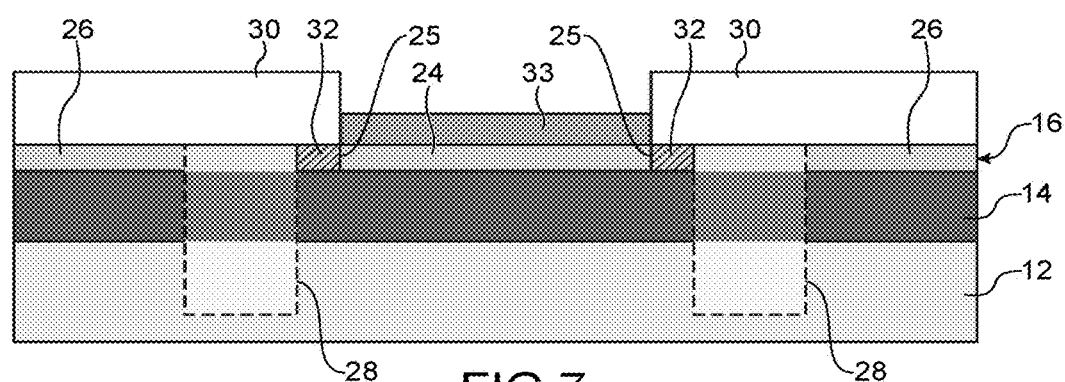
Figure 8:
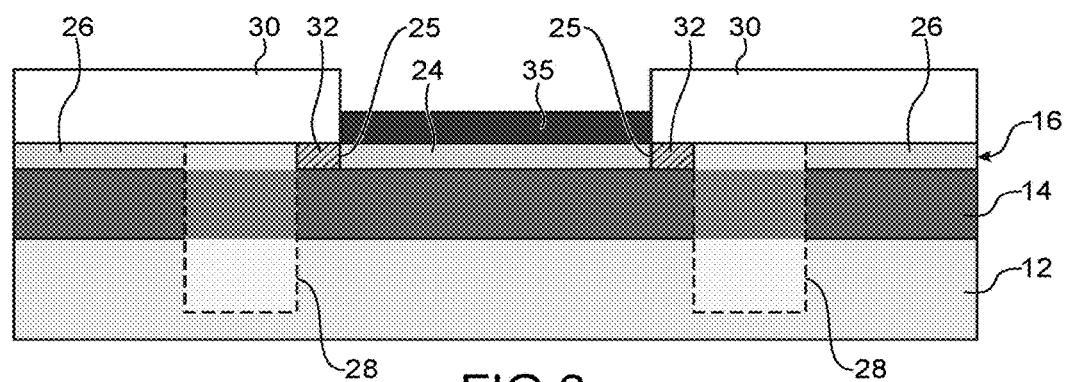

As can be seen on FIG. 6, the edges of the first mask 30 delimiting the first and second parts 24, 26 of the surface layer 16 are not aligned with the locations that will later form the isolation trenches 28. The pattern of the first mask 30 defines the first and second parts 24, 26 of the surface layer 16 such that portions 32 of the second part 26 of the surface layer 16, in other words that will be formed from silicon, are included within the zone that will be used to fabricate P type transistors, in contact with at least two first opposite edges 25 of the first part 24 of the surface layer 16. In the particular embodiment described herein, the second part 26 of the surface layer 16 is arranged all around the first part 24 of the surface layer 16 that will be formed from compressively strained SiGe. Thus, portions 32 of the second part 26 of the surface layer 16 are also placed in contact with at least two second edges 27 (visible on FIG. 12) opposite the first part 24 of the surface layer 16 and that are approximately perpendicular to the two first edges 25. The edges of the zone used for fabrication of P type transistors in this case will be delimited by the portions 32. On FIG. 6, these portions 32 are shown cross-hatched to distinguish them from other parts of the surface layer 16.

After fabricating the first mask 30 on the surface layer 16, steps are implemented to transform the silicon in the first part 24 of the surface layer 16 into compressively strained SiGe. The first step to achieve this is to form a layer of SiGe 33 by epitaxy on the first part 24 of the surface layer 16 that is not covered by the first mask 30 (see FIG. 7). The thickness of this SiGe layer 33 may for example be between about 5 nm and 30 nm, and the percentage of germanium in the SiGe in this layer, in other words the atomic percentage of germanium in this SiGe, may for example be between about 20% and 50%. This SiGe layer 33 may be covered by a silicon oxide layer (not shown on FIG. 7), for example with a thickness between about 5 nm and 50 nm.

A thermal oxidation step of this SiGe layer 33 is then applied. This oxidation may for example include a first dry oxidation step, for example by Rapid Thermal Oxidation (RTO) applied at a temperature between about 850° C. and 950° C., or between 900° C. and 1100° C. for diffusion of the germanium atoms. A second annealing step under a neutral atmosphere, for example an $N_2$ atmosphere, can be used, for example at a temperature higher than the temperature of the previous oxidation and between about 950° C. and 1100° C. to homogenise the concentration of Ge in the layer. The temperatures involved in this oxidation are less than the melting temperature of the strained semiconductor in the first part 24. These two steps can be applied once, in this case with a first oxidation step applied for a sufficiently long time to obtain the required germanium concentration in the semiconductor of the first part 24 of the surface layer 16 at the end of this first step. As a variant, these two steps can be applied cyclically several times one after the other, in this case with shorter first oxidation steps. The enrichment of the semiconductor in the first part 24 with germanium can be such that the germanium content in the strained SiGe obtained is between about 20% and 50%.

This oxidation provokes a migration of germanium atoms originating from the SiGe layer 33 into the silicon in the first part 24 of the surface layer 16. The enrichment of germanium in the silicon modifies the nature of this semiconductor that becomes compressively strained SiGe. At the end of this step, the semiconductor in the first part 24 of the surface layer 16, in other words the semiconductor in the surface layer 16 that is not covered by the first mask 30, is compressively strained SiGe. Due to the presence of the first mask 30 covering the second part 26 of the surface layer 16, the nature of the silicon in this second part 26 is not modified by the application of these steps. An oxide layer 35 formed by oxidation of the SiGe layer 33 (visible on FIG. 8), for example including predominantly $SiO_2$, and the first mask 30 are then removed.

Figure 9:
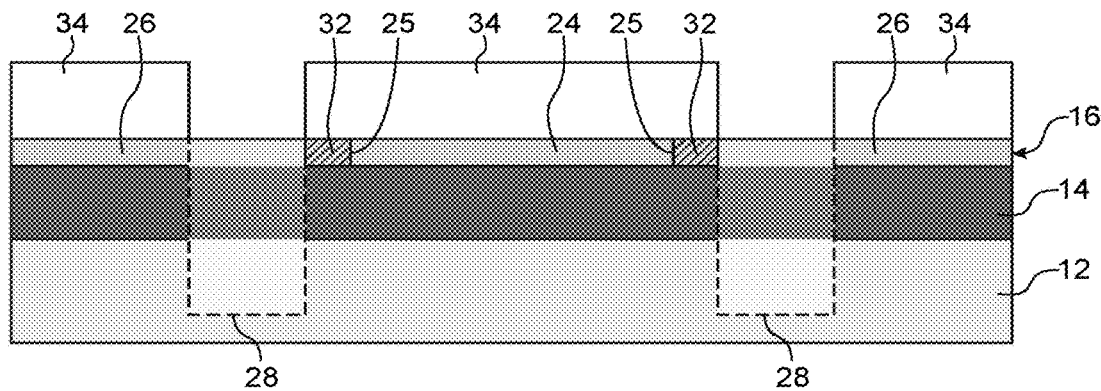
Figure 10:
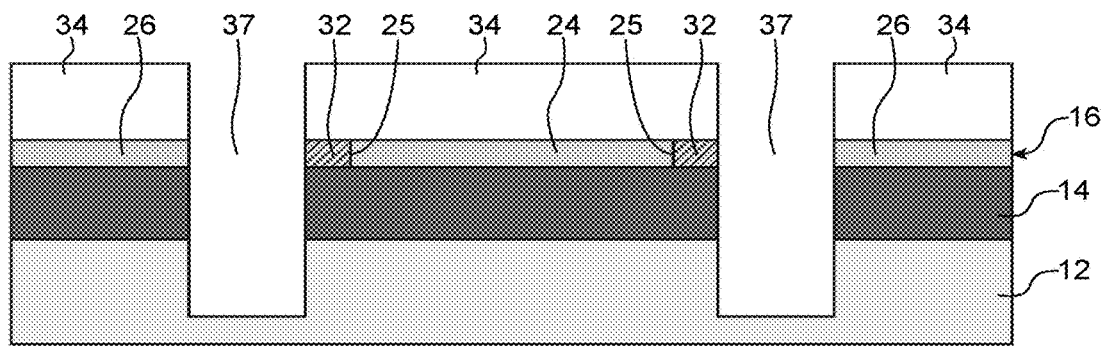

A second mask 34, corresponding to an etching mask, is then formed on the surface layer 16 (FIG. 9). The opening(s) in the second mask 34 define the isolation trench(es) that will be made at least in the surface layer 16. In the example embodiment described herein, the isolation trenches will pass through the layers 16 and 14 and part of the thickness of the support layer 12, so as to electrically isolate the different zones made in the surface layer 16 from each other. The layers 16, 14 and 12 are then etched to the pattern in the second mask 34 (see FIG. 10). The trench(es) 37 pass(es) entirely through the layers 16 and 14 and part of the thickness of the support layer 12.

Due to the presence of the portions 32 that surround the first part 24 of the surface layer 116 that comprises the compressively strained SiGe, the SiGe of the first part 24 does not relax excessively due to these portions 32 that maintain and contain the strain in the semiconductor in the first part 24 of the surface layer 16. If the portions 32 were not present, excessive relaxation of the SiGe would occur after etching the trench(es) 37 at least in the surface layer 16.

The etched trench(es) 37 is (are) then filled with one or several dielectric materials, for example $SiO_2$, so as to form isolation trenches 36. Deposition of the dielectric material(s) can be followed by a densification annealing. The second mask 34 is then removed, completing formation of the substrate 100 (see FIG. 11).

Figure 12:
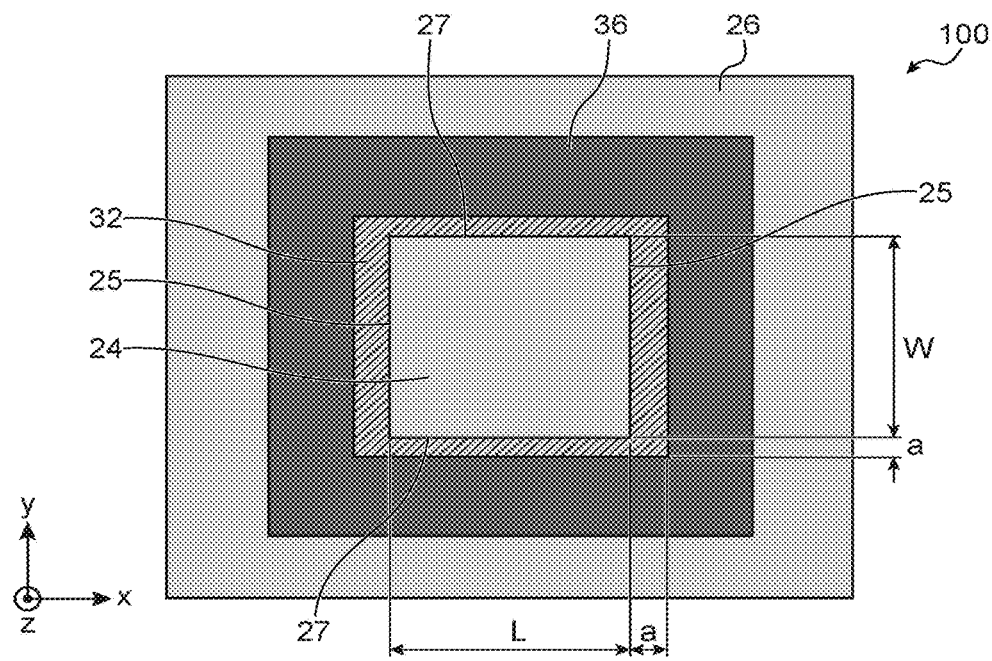
Figure 13:
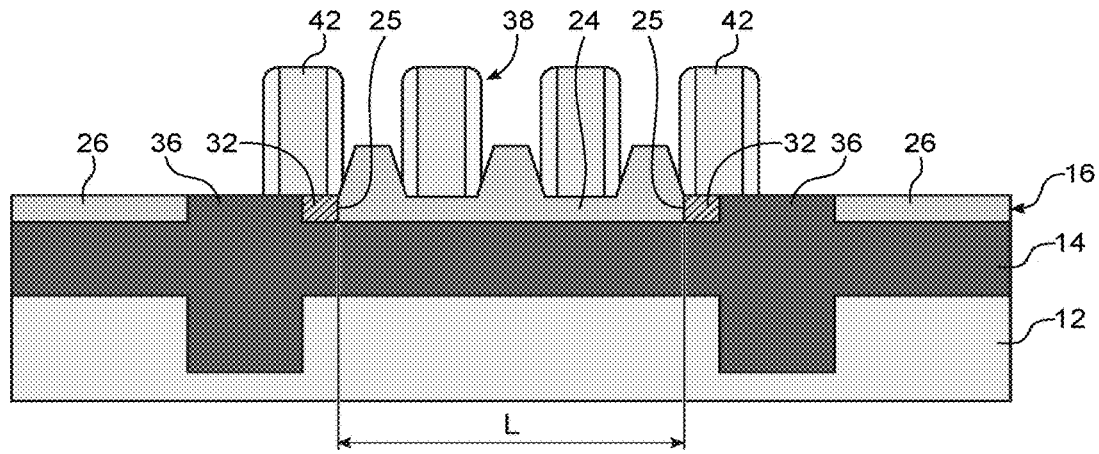

FIG. 12 shows a top view of the part of the surface layer 16 in which P type transistors will be fabricated. The shape of the first part 24 of the surface layer 16 in the principal plane of the surface layer 16 (plane approximately parallel to the interface between the surface layer 16 and the buried dielectric layer 14, or plane parallel to the faces of the surface layer 16 with the largest dimensions), may for example be approximately rectangular, as is the case shown on FIG. 12. This first part 24 of the surface layer 16, comprising compressively strained SiGe, is surrounded by portions 32 that contain silicon and that are located between the two first edges 25 and the two second edges 27 of this first part 24. The isolation trenches 36 surround these portions 32. The dimension denoted "L" is the length of the first part 24, and is parallel to the length of the channels of the transistors that will be made in this first part 24 (the length of the channels corresponding to the dimension of the channels parallel to the direction of transport of charges in the channels). The dimension denoted "W" corresponds to the width of the first part 24, and is parallel to the width of the transistor channels.

Starting from the substrate 100 obtained, transistors are created by applying the different steps forming these transistors (lithography, etching, production of the gates, epitaxy, doping, etc.). P type FET transistors 38 are created in the first part 24 comprising compressively strained SiGe (see FIG. 13).

These transistors 38 are advantageously created with source and drain regions comprising SiGe with a germanium concentration higher than that in the strained SiGe in the first part 24. Thus, the difference in the mesh parameter between the semiconductor (SiGe in the embodiment described) in these source and drain regions and the strained semiconductor (also SiGe in the embodiment described) in the first part 24 tends to generate a compression strain in the channels of the transistors 38, or to increase it as is the case described herein. In the embodiment described herein, a large transfer of the compression strain from the source and drain regions to the channels of the transistors 38 is obtained due to the portions 32 confining the strained SiGe in the first part 24.

In a usual configuration, the transistors closest to the isolation trench 36 are dummy transistors that do not perform any electronic function. On the first part 24, two dummy transistors 42 are shown on FIG. 13. Their gate is located partially on the isolation trenches 36. Furthermore, the portions 32 are also located under these dummy transistors 42.

Figure 11:
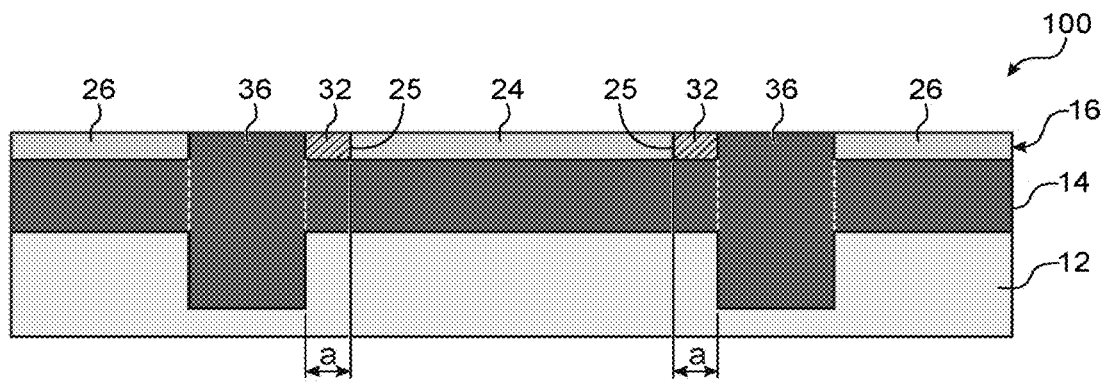

In one preferred embodiment, the width of portions 32 denoted "a" as can be seen on FIGS. 11 and 12, in other words the dimension belonging the principal plane of the surface layer 16 and that is approximately perpendicular to the lateral walls of the isolation trench 36 on each side of the first part 24 of the surface layer 116, is such that the portions 32 do not form part of the channels of P type FET transistors 38 that are not dummies. To achieve this, the width "a" of the portions 32 is for example less than or equal to 0.5 CPP ("Contacted Poly Pitch" that corresponds to the intergate distance, in other words the pitch between the gates of two adjacent transistors). Thus, in the configuration presented in FIG. 13, the portions 32 are not located under the gate of an electrically active transistor, in other words in the channel region of such a transistor (however, the portion 32 can be located in a source or drain region of such a transistor).

With the portions 32 present in contact with all the edges of the first part 24 of the surface layer 16, the compression strain is maintained in the semiconductor of the first part 24 of the surface layer 16 and excessive relaxation of the strain is avoided particularly along two directions approximately perpendicular to each other, one of these two directions corresponding to the direction of current circulation in the channels of the P type transistors 38 (these two directions correspond to directions parallel to the X and Y axes visible on FIG. 12).

Figure 14:
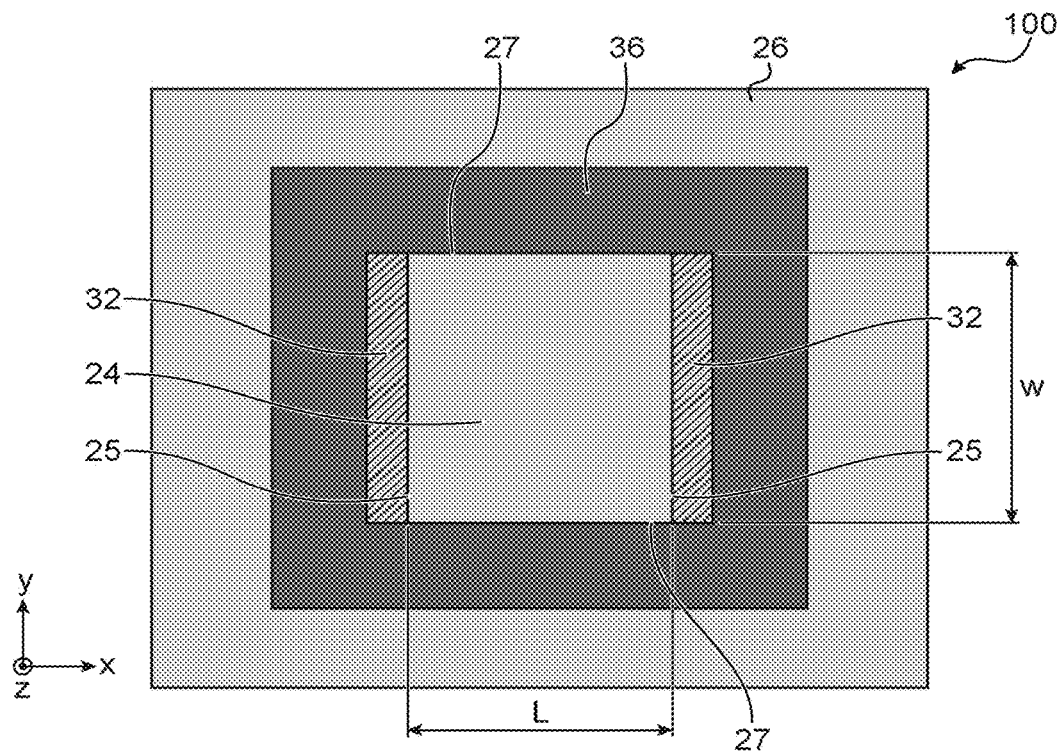
FIGS. 14 to 16 represent variants of the method of fabricating a semiconducting substrate according to this invention.

According to one variant, it is possible that the portions 32 are not present in contact with all the edges of the first part 24 of the surface layer 16. FIG. 14 represents such a variant embodiment. On this figure, the portions 32 are located in contact with the two first edges 25 opposite the first part 24 of the surface layer 16. Each of the two portions 32 is oriented, in other words their largest dimension is, approximately perpendicular to the length of the channels of the transistors that will be made in the first part 24 of the surface layer 16. No portion 32 is present in contact with the second edges 27 of the first part 24 of the surface layer 16 that are approximately parallel to the length L. According to this variant, excessive relaxation of the compressive strain is prevented along the axis parallel to the length L due to the presence of portions 32 in contact with the first edges 25 of the first part 24 of the surface layer 16. On the other hand, relaxation of the strain can occur along the axis parallel to the width W of the first part 24 of the surface layer 16 due to the absence of portions 32 in contact with the second edges 27 of the first part 24 of the surface layer 16. Thus, conditions are obtained that are conducive to maintaining the compressive strain along the length L and conducive to relaxation of the compression strain along the width W. This configuration is conducive to obtaining a higher compression strain along the axis parallel to the length L.

Figure 15:
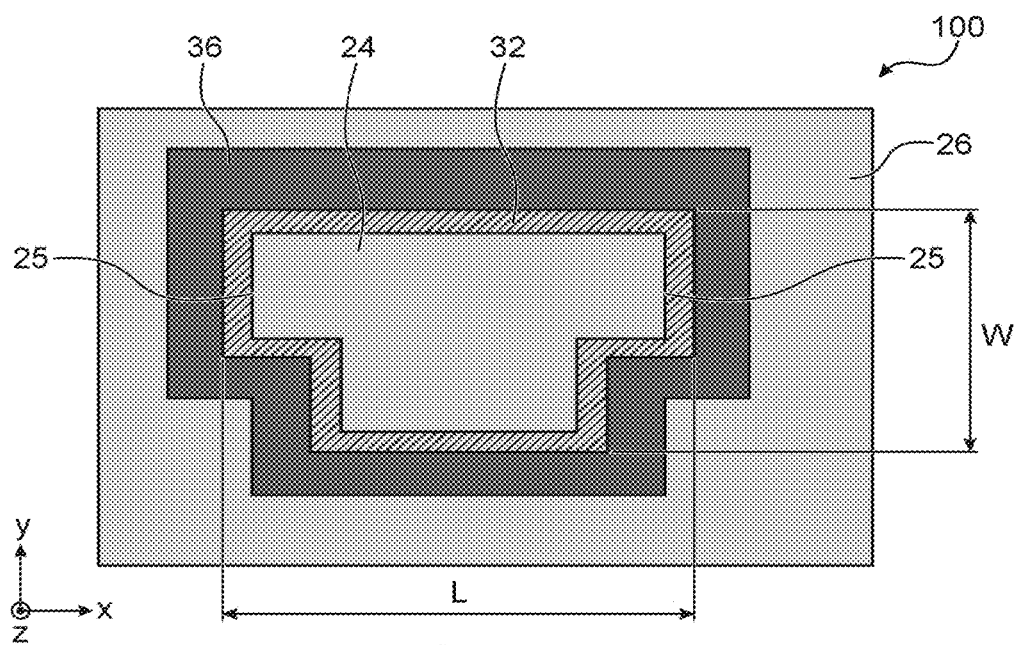

In the embodiment and the variants described above, the shape of the first part 24 of the surface layer 16 in which the semiconductor is compressively strained is approximately rectangular. As a variant, it is possible that the shape of the section of this first part 24 in the principal plane of the surface layer 16 is different from rectangular. FIG. 15 represents an example configuration in which the shape of the section of the first part 24 of the surface layer 16 in the principal plane of the surface layer 16 is a combination of several rectangles. On this figure, all edges of the first part 24 of the surface layer 16 are in contact with portions 32, assuring that relaxation of the compression strain in the semiconductor of the first part 24 is not excessive. In one configuration in which the shape of the section of the first part 24 in the principal plane of the surface layer 16 is not rectangular, it is also possible that some edges oriented along a first direction (for example parallel to the width W) are not in contact with the portions 32 to be conducive to relaxation of the strain along a second direction perpendicular to the first direction.

Figure 16:
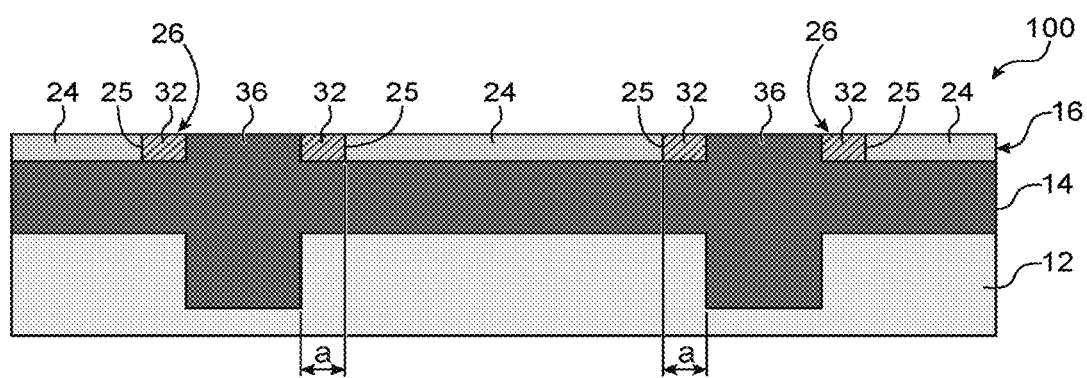

In the embodiment and the variants described above, the semiconducting layer 16 comprises a single first part 24 surrounded by the second part 26. According to one variant shown on FIG. 16, the semiconducting layer 16 may comprise several first parts 24 separated from each other by isolation trenches 36 and at least the two first edges 25 of which are in contact with portions 32 of the or of several second parts 26 of the semiconducting layer 16. On the example shown on FIG. 16, the second part 26 forms portions 32 located in contact with the first edges 25 of two first parts 24 of the compressively strained semiconductor. The second part 26 may or may not form portions 32 located in contact with second edges 27 of one or several of the first parts 24 of the semiconducting layer 16. The different variant embodiments described above can be combined with this variant embodiment.

In the embodiment described above, the compressively strained semiconductor is SiGe, and the portions of material that prevent excessive relaxation of a compression strain of the SiGe comprise silicon. As a variant, semiconductors other than silicon and SiGe can be used, both for the compressively strained semiconductor and for the material different from the compressively strained semiconductor used to form portions of material that prevent excessive relaxation of the strain in the semiconductor of the first portion.

The invention claimed is:

1. A method of fabricating a semiconducting substrate comprising at least implementation of the following steps:
    fabricate a semiconducting layer such that at least one first part of the semiconducting layer comprises a compressively strained semiconductor and such that at least one second part of the semiconducting layer comprises at least one material different from the compressively strained semiconductor, the second part of the semiconducting layer being located in a principal plane of the semiconducting layer in contact with at least two first opposite edges of the first part of the semiconducting layer;

etch at least one trench at least through the semiconducting layer, delimiting the first part of the semiconducting layer and portions of the second part of the semiconducting layer located in contact with said at least two first opposite edges of the first part of the semiconducting layer, relative to the remaining part of the semiconducting layer.

2. A method according to claim 1, in which the material different from the compressively strained semiconductor is not compressively strained or comprises a compression strain with a level lower than that of the compressive strain in the semiconductor in the first part of the semiconducting layer.

3. A method according to claim 1, in which the shape of the section of the first part of the semiconducting layer in the principal plane of the semiconducting layer is approximately rectangular or is a combination of several rectangles.

4. A method according to claim 1, in which the portions of the second part of the semiconducting layer completely surround the first part of the semiconducting layer in the principal plane of the semiconducting layer.

5. A method according to claim 1, in which at least two second opposite edges of the first part of the semiconducting layer approximately perpendicular to the two first edges, are in contact with the trench.

6. A method according to claim 1, in which the compressively strained semiconductor comprises SiGe and/or the material different from the compressively strained semiconductor comprises silicon.

7. A method according to claim 6 in which, when the compressively strained semiconductor comprises SiGe and the material different from the compressively strained semiconductor comprises silicon, the semiconducting layer is made by enrichment with germanium, in a silicon layer.

8. A method according to claim 7 in which, before starting enrichment with germanium, the silicon layer comprises tensilely strained silicon.

9. A method according to claim 6, in which the compressively strained semiconductor has a germanium concentration between about 20% and 50%.

10. A method according to claim 1, also comprising implementation of a step to form at least one dielectric material in the trench after etching of the trench, forming an electrical isolation trench between the first part of the semiconducting layer and portions of the second part of the semiconducting layer.

11. A method according to one claim 1 in which, during fabrication of the semiconducting layer, a buried dielectric layer is arranged between the semiconducting layer and a support layer.

12. A method according to claim 1, in which:
   the semiconducting layer is fabricated such that it comprises several first parts comprising the compressively strained semiconductor, the second part of the semiconducting layer being located in the principal plane of the semiconducting layer in contact with at least the two first opposite edges of each of the first parts of the semiconducting layer, and
   the trench is etched by delimiting the first parts of the semiconducting layer and portions of the second part of the semiconducting layer located in contact with said at least two first opposite edges of each of the first parts of the semiconducting layer.

13. A method of fabricating at least one FET transistor, in which said at least one FET transistor is of the P type and is made in the first part of the semiconducting layer of a semiconducting substrate obtained by use of the method according to claim 1.

14. A method according to claim 13, in which said at least one FET transistor is made in the first part of the semiconducting layer such that the portions of the second part of the semiconducting layer are not located in the channel of said at least one FET transistor.

15. A method according to claim 13, in which the channel of said at least one FET transistor is oriented approximately perpendicular to the two first opposite edges of the first part of the semiconducting layer.

\* \* \* \* \*

UNITED STATES PATENT AND TRADEMARK OFFICE
CERTIFICATE OF CORRECTION

PATENT NO.         : 10,205,021 B1
APPLICATION NO.    : 15/852671
DATED              : February 12, 2019
INVENTOR(S)        : Shay Reboh Page 1 of 1

It is certified that error appears in the above-identified patent and that said Letters Patent is hereby corrected as shown below:

On the Title Page

Item (73), the Assignee's information is incorrect. Item (73) should read:
--(73) Assignee: COMMISSARIAT A L'ENERGIE ATOMIQUE ET AUX ENERGIES ALTERNATIVES, Paris (FR)--

Signed and Sealed this
Third Day of September, 2019

Andrei Iancu
*Director of the United States Patent and Trademark Office*